US012660450B2

(12) United States Patent
Shan et al.

(10) Patent No.: US 12,660,450 B2
(45) Date of Patent: Jun. 16, 2026

(54) DISPLAY PANEL AND WEARABLE ELECTRONIC DEVICE

(71) Applicant: BOE Technology Group Co., Ltd., Beijing (CN)

(72) Inventors: Zhenzhen Shan, Beijing (CN); Hao Zhang, Beijing (CN); Chunyan Xie, Beijing (CN); Libin Liu, Beijing (CN); Xiyu Zhao, Beijing (CN)

(73) Assignee: BOE TECHNOLOGY GROUP CO. , LTD., Beijing (CN)

( * ) Notice: Subject to any disclaimer, the term of this patent is extended or adjusted under 35 U.S.C. 154(b) by 0 days.

(21) Appl. No.: 18/857,833

(22) PCT Filed: Jan. 16, 2024

(86) PCT No.: PCT/CN2024/072462
§ 371 (c)(1),
(2) Date: Oct. 18, 2024

(87) PCT Pub. No.: WO2024/179205
PCT Pub. Date: Sep. 6, 2024

(65) Prior Publication Data
US 2025/0268032 A1 Aug. 21, 2025

(30) Foreign Application Priority Data
Feb. 28, 2023 (CN) .......................... 202310215042.6

(51) Int. Cl.
H10K 59/131 (2023.01)
G04G 17/04 (2006.01)
G09G 3/3266 (2016.01)

(52) U.S. Cl.
CPC ......... H10K 59/131 (2023.02); G04G 17/045 (2013.01); G09G 3/3266 (2013.01);
(Continued)

(58) Field of Classification Search
CPC .. H10K 59/131; G04G 17/045; G04G 9/0064; G09G 3/3266
See application file for complete search history.

(56) References Cited

U.S. PATENT DOCUMENTS

| | | | | |
|---|---|---|---|---|
| 9,430,180 B2 * | 8/2016 | Hirakata | ............... | G06F 1/1652 |
| 2017/0082982 A1 * | 3/2017 | Cho | ......................... | G06F 1/163 |
| 2018/0197482 A1 * | 7/2018 | Choi | .................... | G09G 3/3266 |

FOREIGN PATENT DOCUMENTS

| | | |
|---|---|---|
| CN | 106548711 A | 3/2017 |
| CN | 111650788 A | 9/2020 |

(Continued)

*Primary Examiner* — Sardis F Azongha
(74) *Attorney, Agent, or Firm* — XSENSUS LLP

(57) ABSTRACT

A display panel includes a first display portion, a second display portion and a bonding portion connected to the second display portion. The first display portion extends in an arc shape in a flatten state and surrounds the second display portion in an enclosed state. The first display portion has a first display area and first peripheral area(s) each located at an end of an arc presented by the first display portion. The first display portion includes a plurality of first sub-pixels, first scanning signal lines extending substantially in a second direction and each connected to at least one column of first sub-pixels, first data signal lines extending substantially in a first direction and each connected to at least one row of first sub-pixels, and first gate driver circuit(s) disposed in the first peripheral area(s) and connected to the first scanning signal lines.

20 Claims, 4 Drawing Sheets

(52) U.S. Cl.
CPC ............... *G09G 2310/0281* (2013.01); *G09G 2310/0286* (2013.01)

(56) References Cited

FOREIGN PATENT DOCUMENTS

| | | |
|---|---|---|
| CN | 112652275 A | 4/2021 |
| CN | 116056519 A | 5/2023 |
| JP | 2008090154 A | 4/2008 |

* cited by examiner

DISPLAY PANEL AND WEARABLE ELECTRONIC DEVICE

CROSS-REFERENCE TO RELATED APPLICATIONS

This application is a national phase entry under 35 USC 371 of International Patent Application No. PCT/CN2024/072462, filed on Jan. 16, 2024, which claims priority to Chinese Patent Application No. 202310215042.6, filed on Feb. 28, 2023, each are incorporated herein by reference in their entirety.

TECHNICAL FIELD

The present disclosure relates to the field of display technologies, and in particular, to a display panel and a wearable electronic device.

BACKGROUND

Organic light-emitting diode (OLED) display panels have gradually become one of mainstream products in the display field due to self-luminescence, high contrast, thin thickness, wide viewing angle, fast response speed, capable of being used for flexible panels, wide operating temperature range, simple structure and process, and other excellent performance. OLED display panels may be widely used in terminal products such as smart phones, tablets, TVs and wearable devices (such as watches).

SUMMARY

In an aspect, a display panel is provided. The display panel includes a first display portion and a second display portion. The first display portion extends in an arc shape in a flatten state and surrounds the second display portion in an enclosed state, and the first display portion and the second display portion have an included angle therebetween. The display panel further includes a bonding portion, and the bonding portion is connected to a side of the second display portion. The first display portion has a first display area and at least one first peripheral area, and a first peripheral area is located at an end of an arc presented by the first display portion. The first display portion includes a plurality of first sub-pixels disposed in the first display area and arranged in a plurality of rows and a plurality of columns, each row of first sub-pixels are arranged in a first direction, and each column of first sub-pixels are arranged in a second direction. The first direction is a radial direction of the arc, and the second direction is an extending direction of the arc. The first display portion further includes a plurality of first scanning signal lines, a plurality of first data signal lines and at least one first gate driver circuit. The plurality of first scanning signal lines extend substantially in the second direction and are each connected to at least one column of first sub-pixels. The plurality of first data signal lines extend substantially in the first direction and are each connected to at least one row of first sub-pixels. The at least one first gate driver circuit is disposed in the at least one first peripheral area and are connected to the plurality of first scanning signal lines.

In some embodiments, the first display portion includes a connecting sub-portion and two extending sub-portions. The connecting sub-portion is connected to another side of the second display portion, and the connecting sub-portion and the bonding portion are located on two opposite sides of the second display portion. The two extending sub-portions are connected to two ends of the connecting sub-portion. The display panel further includes two transfer portions. Each transfer portion is connected between an extending sub-portion and the second display portion. The transfer portions are stretchable and deformable. Each transfer portion includes data signal transfer lines, and first data signal lines, located in the two extending sub-portions, in the plurality of first data signal lines are connected to the bonding portion by a plurality of data signal transfer lines including the data signal transfer lines of each transfer portion.

In some embodiments, the second display portion has a second peripheral area. The second display portion includes first fan-out lines disposed in the second peripheral area, and the plurality of data signal transfer lines are connected to the bonding portion by the first fan-out lines.

In some embodiments, the second display portion further has a second display area, and the second peripheral area is disposed around the second display area. The second display portion further includes a plurality of second sub-pixels disposed in the second display area. Each column of second sub-pixels are arranged in a third direction, and each row of second sub-pixels are arranged in a fourth direction. The third direction and the fourth direction are perpendicular to each other.

In some embodiments, the second display portion further includes a second gate driver circuit located in the second peripheral area. The second gate driver circuit includes a plurality of shift registers that are cascaded. The second gate driver circuit is connected to the bonding portion, and the shift registers of the second gate driver circuit are used to provide gate driving signals to the second sub-pixels.

In some embodiments, the display panel further includes a transition portion connected between the connecting sub-portion and the second display portion. The transition portion includes at least one multi-path selection circuit, and first data signal lines, located in the connecting sub-portion, in the plurality of first data signal lines are connected to the at least one multi-path selection circuit. The second display portion includes second data signal lines, ends of part of or all of the second data signal lines are connected to the at least one multi-path selection circuit, and other ends of the second data signal lines are connected to the bonding portion.

In some embodiments, the display panel further includes fourth fan-out lines. The first data signal lines located in the connecting sub-portion are connected to the at least one multi-path selection circuit by the fourth fan-out lines.

In some embodiments, the transition portion includes a plurality of multi-path selection circuits. Each multi-path selection circuit is connected to a single first data signal line and N second data signal lines, where N is an integer greater than or equal to 2.

In some embodiments, the second display portion further includes second fan-out lines disposed in the second peripheral area, and the second data signal lines are connected to the bonding portion by the second fan-out lines.

In some embodiments, the two extending sub-portions are disposed symmetrically relative to a first center line, and data signal transfer lines of the two transfer portions are disposed symmetrically relative to the first center line.

In some embodiments, the first display portion further includes at least one third control signal line disposed in the at least one first peripheral area and extending substantially in the first direction. A third control signal line connects a first gate driver circuit and the bonding portion.

In some embodiments, the display panel further includes a transfer portion, the transfer portion includes a control signal transfer line, and the third control signal line is connected to the bonding portion by the control signal transfer line.

In some embodiments, the second display portion has a second peripheral area. The second display portion includes a third fan-out line disposed in the second peripheral area, and the control signal transfer line is connected to the bonding portion by third fan-out line.

In some embodiments, the first display portion has two first peripheral areas located at two ends of the arc presented by the first display portion. The first display portion includes two first gate driver circuits respectively located in the two first peripheral areas.

In some embodiments, each first gate driver circuit includes a plurality of shift registers that are cascaded. Each first scanning signal line extends from a first peripheral area to another first peripheral area, and two ends of the first scanning signal line are each connected to a shift register.

In some embodiments, the transfer portion is provided with a plurality of openings therein. In a case where the display panel includes the data signal transfer lines, the data signal transfer lines are disposed bypassing the plurality of openings.

In some embodiments, the transfer portion is provided with a plurality of openings therein. In a case where the display panel includes the control signal transfer line, the control signal transfer line is disposed bypassing the plurality of openings.

In some embodiments, the second display portion includes a display surface and a non-display surface that are opposite to each other. The bonding portion is capable of being bent to the non-display surface of the second display portion, and the transfer portions are capable of being bent to the non-display surface of the second display portion.

In some embodiments, the plurality of first sub-pixels are arranged in a radial pattern.

In some embodiments, in the first direction, an arrangement density of a column of first sub-pixels farther away from the second display portion is less than or equal to an arrangement density of a column of first sub-pixels closer to the second display portion.

In another aspect, a wearable electronic device is provided. The wearable electronic device includes the display panel as described in any of the above embodiments. The wearable electronic device further includes a wearable structure. The wearable structure is connected to the display panel, and the wearable structure is configured to be wearable on a human body.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, but are not limitations on an actual size of a product, an actual process of a method and an actual timing of a signal to which the embodiments of the present disclosure relate.

DETAILED DESCRIPTION

Figure 1:
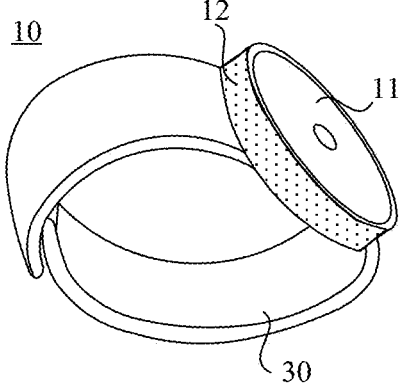
FIG. 1 is a structural diagram of a watch, in accordance with some embodiments.

Technical solutions in some embodiments of the present disclosure will be described clearly and completely with reference to the accompanying drawings below. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as open and inclusive, i.e., "including, but not limited to". In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics described herein may be included in any one or more embodiments or examples in any suitable manner.

Hereinafter, the terms such as "first" and "second" are used for descriptive purposes only, and are not to be construed as indicating or implying the relative importance or implicitly indicating the number of indicated technical features. Thus, features defined with "first" or "second" may explicitly or implicitly include one or more of the features. In the description of the embodiments of the present disclosure, the term "a plurality of" or "the plurality of" means two or more unless otherwise specified.

In the description of some embodiments, the expressions "coupled" and "connected" and derivatives thereof may be used. The term "connection" should be understood in a broad sense. For example, the "connection" may be a fixed connection, a detachable connection, or of an integrated structure; it may be a direct connection or an indirect connection by an intermediate medium. The term "coupled" indicates, for example, that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the content herein.

The phrase "at least one of A, B and C" has a same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

The term "about", "substantially" or "approximately" as used herein includes a stated value and an average value within an acceptable range of deviation of a particular value. The acceptable range of deviation is determined by a person of ordinary skill in the art in consideration of the measurement in question and errors associated with the measurement of a particular quantity (i.e., limitations of the measurement system).

The term such as "parallel", "perpendicular" or "equal" as used herein includes a stated condition and a condition similar to the stated condition. A range of the similar condition is within an acceptable range of deviation. The acceptable range of deviation is determined by a person of ordinary skill in the art in view of measurement in question and errors associated with the measurement of a particular quantity (i.e., limitations of the measurement system). For example, the term "parallel" includes absolute parallelism and approximate parallelism, and an acceptable range of deviation of the approximate parallelism may be a deviation within 5°; the term "perpendicular" includes absolute perpendicularity and approximate perpendicularity, and an acceptable range of deviation of the approximate perpendicularity may also be a deviation within 5°; and the term "equal" includes absolute equality and approximate equality, and an acceptable range of deviation of the approximate equality may be a difference between two equals being less than or equal to 5% of either of the two equals.

It will be understood that when a layer or element is referred to as being on another layer or substrate, the layer or element may be directly on the another layer or substrate, or there may be intermediate layer(s) between the layer or element and the another layer or substrate.

Exemplary embodiments are described herein with reference to sectional views and/or plan views as idealized exemplary drawings. In the accompanying drawings, thicknesses of layers and sizes of areas/regions are enlarged for clarity. Variations in shapes relative to the accompanying drawings due to, for example, manufacturing technologies and/or tolerances may be envisaged. Therefore, the exemplary embodiments should not be construed to be limited to the shapes of areas/regions shown herein, but to include deviations in the shapes due to, for example, manufacturing. For example, an etched area/region shown in a rectangular shape generally has a feature of being curved. Therefore, the areas/regions shown in the accompanying drawings are schematic in nature, and their shapes are not intended to show actual shapes of the areas/regions in a device, and are not intended to limit the scope of the exemplary embodiments.

In some embodiments, as shown in FIG. 1, the embodiments provide a watch 10. The watch 10 includes a main display screen 11 and a secondary display screen 12 in an arc shape disposed at an edge of the main display screen 11.

For example, the main display screen 11 and the secondary display screen 12 may perform independent display, and/or the main display screen 11 and the secondary display screen 12 may perform synchronous display. For example, in a case where the main display screen 11 and the secondary display screen 12 perform independent display, when the watch 10 is in a non-wrist-raising state, only the secondary display screen 12 may display, for example, display the battery level, time or other functional graphic information to reduce energy consumption; and when the watch 10 is in a wrist-raising state, only the main display screen 11 may display. Alternatively, the main display screen 11 and the secondary display screen 12 display images synchronously, and due to a difference between a distance from the main display screen 11 to human eyes and a distance from the secondary display screen 12 to human eyes, the human eyes may observe 3D displayed pictures.

For example, as shown in FIG. 1, the watch 10 further includes a watch strap 30. Both ends of the watch strap 30 are connected to side portions of the secondary display screen 12 away from the main display screen 11. The provision of the watch strap 30 facilitates wearing and fixing of the watch 10.

Figure 2:
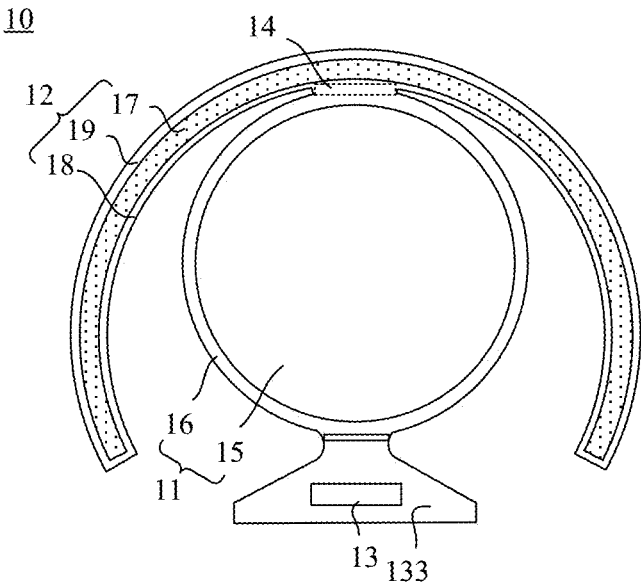
FIG. 2 is a structural diagram of another watch, in accordance with some embodiments.

FIG. 2 is a structural diagram of the main display screen 11 and the secondary display screen 12 of the watch 10 in a flatten state. As shown in FIG. 2, a connection area 14 is provided between the main display screen 11 and the secondary display screen 12, and the connection area 14 connects the main display screen 11 and the secondary display screen 12. For example, when the watch 10 is in an unfolded state shown in FIG. 2, the connection area 14 is located at the top of the main display screen 11, and the secondary display screen 12 is connected to the top of the main display screen 11 through the connection area 14.

In some examples, the main display screen 11 includes a main display screen display area 15 and a first border area 16 disposed around the main display screen display area 15. The main display screen display area 15 is connected to the first border area 16. The secondary display screen 12 includes a secondary display screen display area 17, and an inner border area 18 and an outer border area 19 located on both sides of the secondary display screen display area 17. The secondary display screen display area 17 is connected to the inner border area 18 and the outer border area 19. The inner border area 18 is located on a side of the secondary display screen display area 17 proximate to the main display screen 11, and the outer border area 19 is located on a side of the secondary display screen display area 17 away from the main display screen 11.

In some examples, as shown in FIG. 2, the watch 10 further includes a bonding area 133. The bonding area 133 is connected to the main display screen 11, and a driver chip 13 is disposed in the bonding area 133. The driver chip 13 is used to drive the main display screen 11 and the secondary display screen 12 to perform display.

Figures 3, 4:
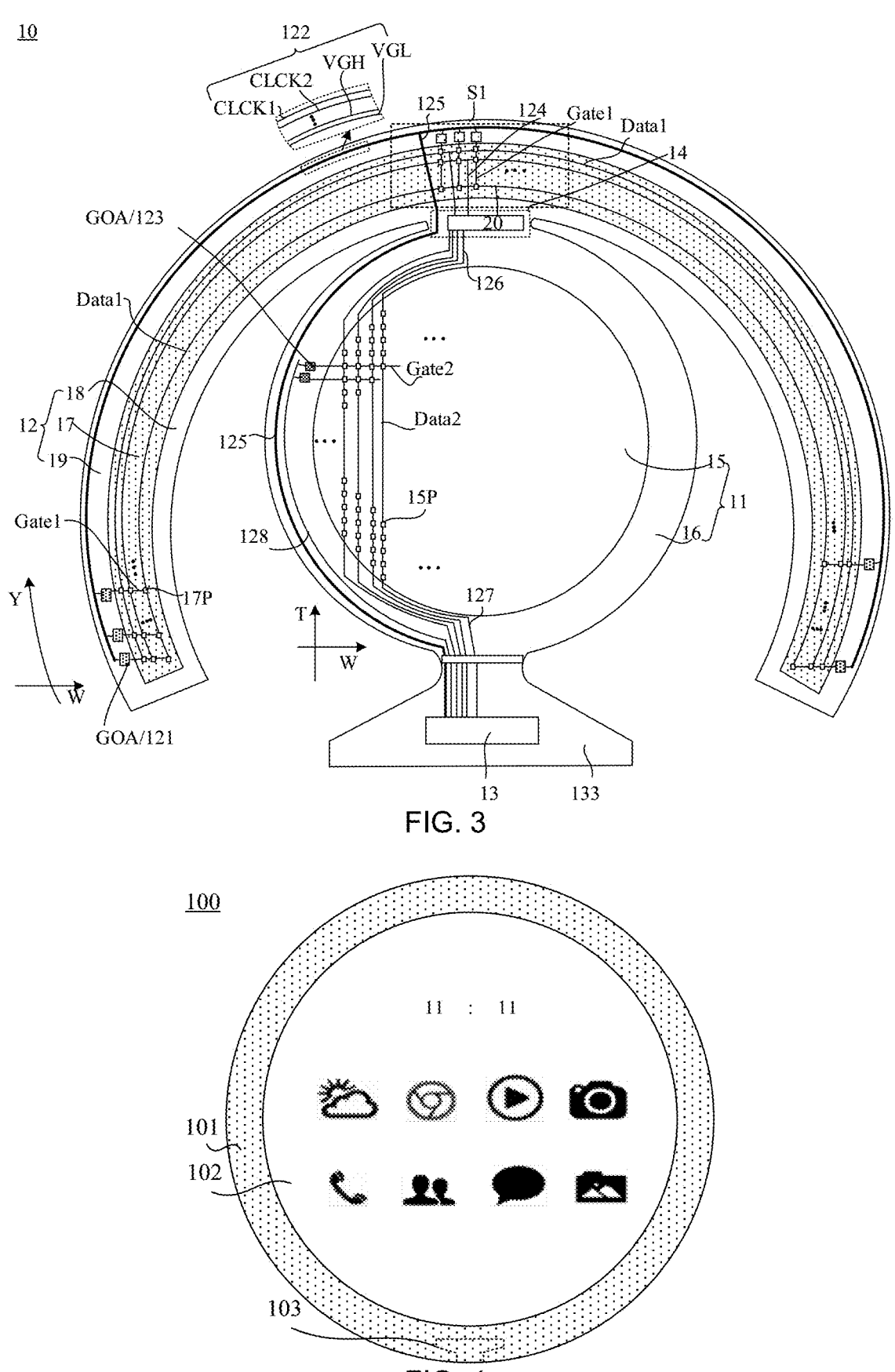
FIG. 3 is a structural diagram of yet another watch, in accordance with some embodiments.
FIG. 4 is a structural diagram of a display device, in accordance with some embodiments of the present disclosure.

For example, as shown in FIG. 3, the secondary display screen display area 17 is provided with a plurality of first sub-pixels 17P, and the plurality of first sub-pixels 17P are arranged in an array in a fourth direction W and a second direction Y The fourth direction W is a horizontal direction as shown in FIG. 3, and the second direction Y is parallel to an extension direction of an arc shape in which the secondary display screen display area 17 appears. For example, multiple first sub-pixels 17P arranged in the fourth direction W are referred to as sub-pixels in a row, and multiple first sub-pixels 17P arranged in the second direction Y are referred to as sub-pixels in a column.

The secondary display screen display area 17 is provided with a plurality of first data signal lines Data1, and a first data signal line Data1 is connected to at least one column of first sub-pixels 17P. FIG. 3 shows a case where a first data signal line Data1 is connected to a column of first sub-pixels 17P. The first data signal line Data1 is used to transmit a data signal to the first sub-pixels 17P. The first data signal line Data1 is connected to a column of first sub-pixels 17P, a column of first sub-pixels 17P are arranged in the second direction Y, and the second direction Y is parallel to the extension direction of the arc shape in which the secondary display screen display area 17 appears. Therefore, an extension direction of the first data signal line Data1 is parallel to the extension direction of the arc shape in which the secondary display screen display area 17 appears, and the provision method of the first data signal line Data1 has the problem of large voltage drop.

The outer border area 19 of the secondary display screen 12 is provided with a first gate driver circuit 121. The first gate driver circuit 121 includes a plurality of shift registers GOA that are cascaded. A shift register GOA is connected to at least one row of first sub-pixels 17P through a first scanning signal line Gate1. FIG. 3 shows a case where a shift register GOA is connected to a row of first sub-pixels 17P through a first scanning signal line Gate1. The first gate driver circuit 121 is used to transmit a gate signal to the first sub-pixels 17P.

The outer border area 19 of the secondary display screen 12 is further provided with a first control signal line 122. For example, the first control signal line 122 includes a plurality of control signal lines, and the plurality of control signal lines include a plurality of clock signal lines (e.g., a first clock signal line CLCK1 and a second clock signal line CLCK2), a first voltage bus VGH, a second voltage bus VGL, an initial signal line, a reset signal line and the like, which are not limited here. The plurality of control signal lines are connected to the first gate driver circuit 121 and are used to provide the first gate driver circuit 121 with control signals required for operation, so that the first gate driver circuit 121 outputs a gate signal.

Since the first gate driver circuit 121 is disposed in the outer border area 19 of the secondary display screen 12, the outer border area 19 of the secondary display screen 12 has a wide border.

The main display screen display area 15 is provided with a plurality of second sub-pixels 15P, and the plurality of second sub-pixels 15P are arranged in an array in the fourth direction W and a third direction T. The fourth direction W is a horizontal direction as shown in FIG. 3, and the third direction T is perpendicular to the fourth direction W For example, multiple second sub-pixels 15P arranged in the fourth direction W are referred to as sub-pixels in a row, and multiple second sub-pixels 15P arranged in the third direction T are referred to as sub-pixels in a column.

The main display screen display area 15 is provided with a plurality of second data signal lines Data2, and a second data signal line Data2 is connected to at least one column of second sub-pixels 15P. FIG. 3 shows a case where a second data signal line Data2 is connected to a column of second sub-pixels 15P. The second data signal line Data2 is used to transmit a data signal to the second sub-pixels 15P.

The first border area 16 of the main display screen 11 is provided with a second gate driver circuit 123. The second gate driver circuit 123 includes a plurality of shift registers GOA that are cascaded. A shift register GOA is connected to at least one row of second sub-pixels 15P through a second scanning signal line Gate2. FIG. 3 shows a case where a shift register GOA is connected to a row of second sub-pixels 15P through a second scanning signal line Gate2. The second gate driver circuit 123 is used to transmit a gate signal to the second sub-pixels 15P.

The first border area 16 of the main display screen 11 is further provided with a second control signal line 128. For example, the second control signal line 128 includes a plurality of control signal lines, and the plurality of control signal lines include a plurality of clock signal lines, a first voltage bus, a second voltage bus and the like, which are not limited here. The plurality of control signal lines are electrically connected to the second gate driver circuit 123 and are used to provide the second gate driver circuit 123 with control signals required for operation, so that the second gate driver circuit 123 outputs a gate signal. The second control signal line 128 is connected to the driver chip 13, and the driver chip 13 is used to provide corresponding signals to the plurality of control signal lines of the second control signal line 128.

In some examples, as shown in FIG. 3, the main display screen 11 and the secondary display screen 12 share data signals.

The connection area 14 is provided with a multi-path selection circuit 20, and the secondary display screen 12 is further provided with a plurality of fourth fan-out lines 124. The first data signal line Data1 is connected to the multi-path selection circuit 20 by a fourth fan-out line 124, and the fourth fan-out line 124 extends across the secondary display screen display area 17 to the connection area 14. The first border area 16 of the main display screen 11 is further provided with fifth fan-out lines 126 and second fan-out lines 127. The second data signal line Data2 is connected to the multi-path selection circuit 20 by a fifth fan-out line 126, and the second data signal line Data2 is connected to the driver chip 13 by a second fan-out line 127, thereby realizing the data signal sharing between the main display screen 11 and the secondary display screen 12.

In some examples, as shown in FIG. 3, the main display screen 11 and the secondary display screen 12 of the watch 10 are driven by the same driver chip 13, and therefore, the first control signal line 122 of the secondary display screen 12 needs to be connected to the driver chip 13. The secondary display screen 12 and the first border area 16 of the main display screen 11 are further provided with a first scanning fan-out line 125. It can be understood that the first scanning fan-out line 125 includes a plurality of fan-out lines, and the plurality of fan-out lines of the first scanning fan-out line 125 are connected to the control signal lines of the first control signal line 122 in one to one correspondence. The other end of the first scanning fan-out line 125 is connected to the driver chip 13. The first scanning fan-out line 125 extends from the outer border area 19 of the secondary display screen 12, crosses the secondary display screen display area 17 and the inner border area 18, passes through the connection area 14, and extends along the first border area 16 of the main display screen 11. The signal line is relatively long and thus there is a problem of large voltage drop.

In addition, as shown in FIG. 3, in an area S1 of the secondary display screen 12 at a side of the connection area 14 away from the main display screen 11, the first scanning fan-out line 125 extends across the secondary display screen display area 17 to the connection area 14. Moreover, in the area S1, the first scanning signal line Gates1 and the fourth fan-out lines 124 both extend across the secondary display screen display area 17 to the connection area 14. Therefore, there is a problem of being prone to signal crosstalk caused by the plurality of signal lines arranged in parallel in the area S1.

Moreover, in order to prevent the first scanning fan-out line 125 and the fourth fan-out lines 124 from crossing other signal lines (e.g., the first data signal lines Data1) in the secondary display screen display area 17, it is necessary to provide the first scanning fan-out line 125 and the fourth fan-out lines 124 in a film layer different from other signal lines in the secondary display screen display area 17. For example, the first data signal lines Data1 in the secondary display screen display area 17 are located in a source-drain metal layer, and the first scanning fan-out line 125 and the fourth fan-out lines 124 are disposed in a shielding layer. Therefore, it is necessary to perform the signal line transfer between the source-drain metal layer and the shielding layer, which will further aggravate the problem of large voltage drop of the signal line.

Figure 5:
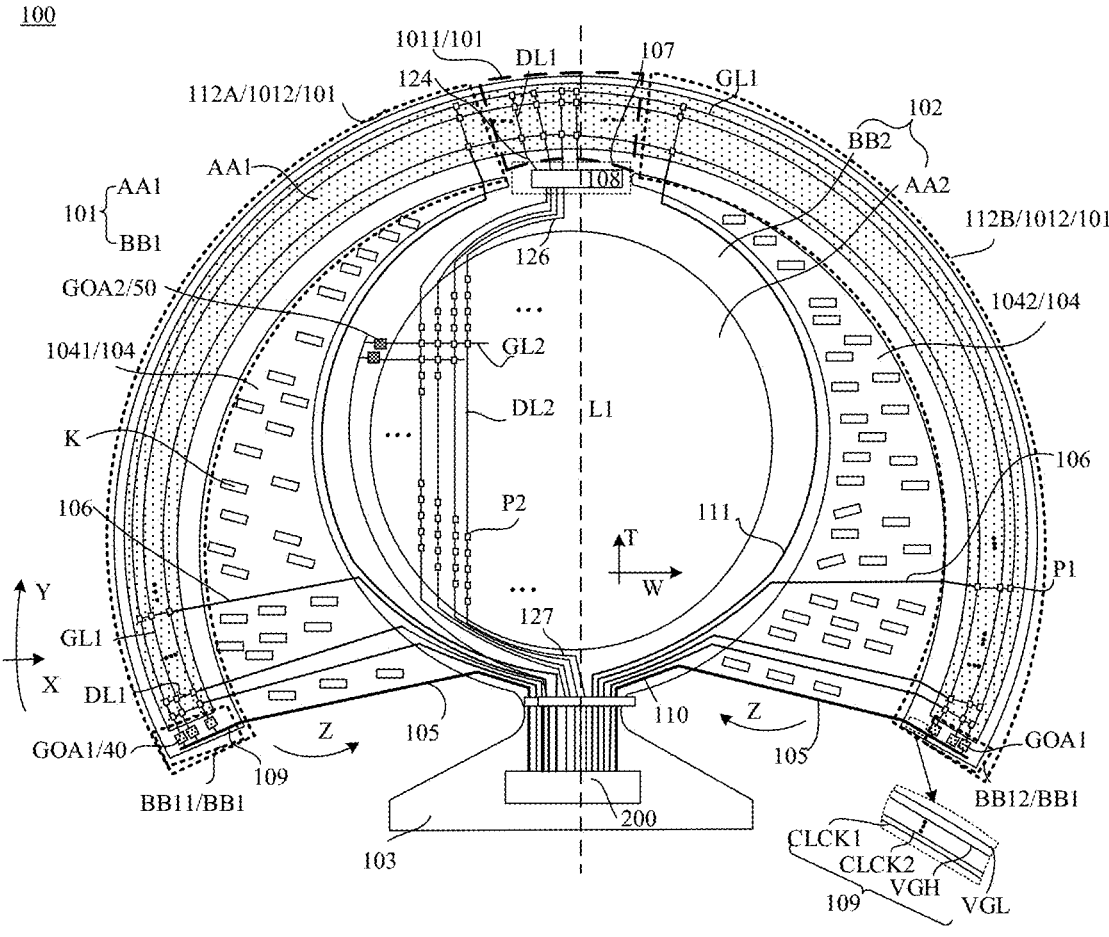
FIG. 5 is a structural diagram of a display panel, in accordance with some embodiments of the present disclosure.
Figure 6:
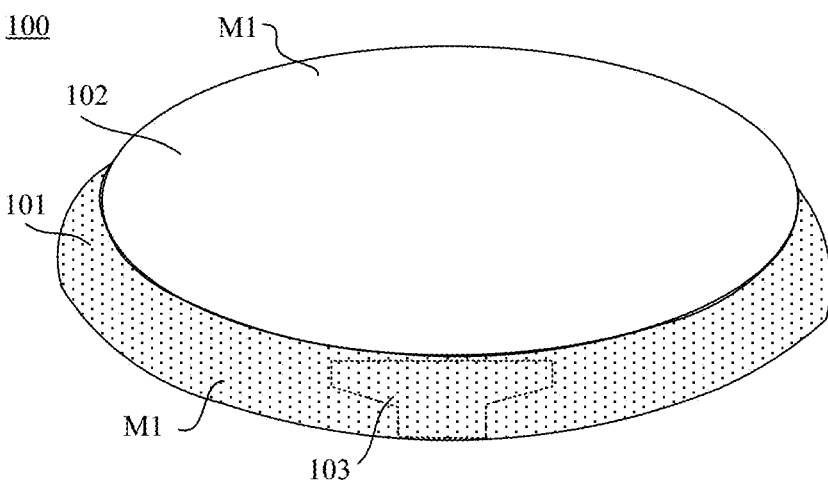
FIG. 6 is a structural diagram of another display panel, in accordance with some embodiments of the present disclosure.

In light of this, as shown in FIGS. 4, 5 and 6, some embodiments of the present disclosure provide a display panel 100. The display panel 100 includes a first display portion 101, a second display portion 102 and a bonding portion 103. The first display portion 101 extends in an arc shape in a flatten state, and surrounds the second display portion 102 in an enclosed state. The first display portion 101 and the second display portion 102 have an included angle therebetween.

For example, FIG. 5 is a structural diagram of the display panel 100 in a flatten state (the first display portion 101 in a flatten state). FIG. 6 is a structural diagram of the display panel 100 when the first display portion 101 is in an enclosed state, that is, a structural diagram of the first display portion 101 in an enclosed state. The first display portion 101 and the second display portion 102 may display images.

As shown in FIG. 5, the first display portion 101 is connected to the second display portion 102. As shown in FIG. 6, the first display portion 101 can be bent to enclose the second display portion 102, so that the first display portion 101 may surround the second display portion 102, and the first display portion 101 and the second display portion 102 have an included angle therebetween.

Figure 7:
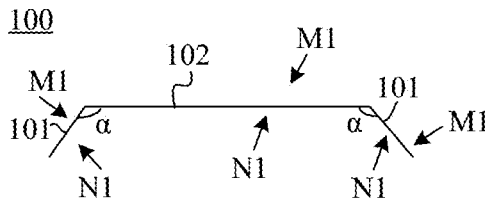
FIG. 7 is a structural diagram of yet another display panel, in accordance with some embodiments of the present disclosure.

It can be understood that as shown in FIG. 7, the first display portion 101 and the second display portion 102 each include a display surface M1 and a non-display surface N1 that are oppositely disposed. For example, after the first display portion 101 encloses the second display portion 102, an included angle α between a non-display surface N1 of the first display portion 101 and a non-display surface N1 of the second display portion 102 is 90°, 120°, 135° or 150°, which is not specifically limited in the embodiments of the present disclosure.

For example, in a case where FIG. 5 shows display surfaces M1 of the first display portion 101 and the second display portion 102, directions of arrows Z shown in FIG. 5 are an closing direction of two side areas of the first display portion 101, that is, the two side areas of the first display portion 101 are bent in the directions of the arrows Z to form a structure shown in FIG. 6.

As shown in FIG. 5, the bonding portion 103 is connected to a side of the second display portion 102.

For example, as shown in FIG. 5, a top end of the second display portion 102 is connected to the first display portion 101, and the bonding portion 103 is connected to a bottom end of the second display portion 102. The second display portion 102 includes a display surface M1 and a non-display surface N1 (as shown in FIG. 7) that are opposite. The bonding portion 103 can be bent to the non-display surface N1 of the second display portion 102 to reduce an influence of the bonding portion 103 on a width of a border of the display panel 100, thereby being beneficial to achieving a narrow border of the display panel 100.

As shown in FIG. 5, the first display portion 101 has a first display area AA1 and a first peripheral area BB1. The first peripheral area BB1 is located at ends of an arc formed by the first display portion 101. The first display portion 101 includes a plurality of first sub-pixels P1 disposed in the first display area AA1 and arranged in a plurality of rows and a plurality of columns. Each row of first sub-pixels P1 are arranged in a first direction X, and each column of first sub-pixels P1 are arranged in a second direction Y The first direction X is a radial direction of the arc, and the second direction Y is an extending direction of the arc.

For example, the first direction X is perpendicular to the second direction Y.

The display panel 100 further includes first scanning signal lines GL1, first data signal lines DL1, and first gate driver circuit(s) 40. The first scanning signal line GL1 substantially extends in the second direction Y and is connected to at least one column of first sub-pixels P1. The first data signal line DL1 extends substantially in the first direction X and is connected to at least one row of first sub-pixels P1. The first gate driver circuit 40 is disposed in the first peripheral area BB1 and connected to first scanning signal lines GL1.

For example, FIG. 5 shows that a first scanning signal line GL1 is connected to a column of first sub-pixels P1, and the first scanning signal line GL1 is used to transmit a gate signal to the first sub-pixels P1; and a first data signal line DL1 is connected to a row of first sub-pixels P1, and the first data signal line DL1 is used to transmit a data signal to the first sub-pixels P1.

In the embodiments of the present disclosure, the first gate driver circuit 40 is disposed in the first peripheral area BB1, and the first peripheral area BB1 is disposed at an end of an arc formed by the first display portion 101, that is, the first gate driver circuit 40 is disposed at an end of the arc formed by the first display portion 101. Thus, it is not necessary to occupy space of inner and outer borders of the first display area AA1, so as to narrow side borders of the first display portion 101, thereby having a rather good display effect. Moreover, the first data signal line DL1 extends substantially in the first direction X, and the first direction X is a radial direction of the arc. Therefore, an extension length of the first data signal line DL1 is shortened, and thus the voltage drop of signal transmission may be reduced.

In some embodiments, as shown in FIG. 5, the first display portion 101 includes a connecting sub-portion 1011 and two extending sub-portions 1012. The connecting sub-portion 1011 is connected to a side of the second display portion 102, and the connecting sub-portion 1011 and the bonding portion 103 are located on two opposite sides of the second display portion 102. The two extending sub-portions 1012 are connected to two ends of the connecting sub-portion 1011.

The display panel 100 further includes two transfer portions 104, and each transfer portion 104 is connected between an extending sub-portion 1012 and the second display portion 102. The transfer portion 104 is stretchable and deformable. The transfer portion 104 includes data signal transfer lines 106, and first data signal lines DL1 located in the two extending sub-portions 1012 are connected to the bonding portion 103 by the data signal transfer lines 106.

For example, as shown in FIG. 5, the two transfer portions 104 are a first transfer portion 1041 and a second transfer portion 1042. The two extending sub-portions 1012 are a first extending sub-portion 112A and a second extending sub-portion 112B. The first extending sub-portion 112A is connected to the second display portion 102 through the first transfer portion 1041, and first data signal lines DL1 of the first extending sub-portion 112A are connected to the bonding portion 103 by data signal transfer lines 106 of the first transfer portion 1041. The second extending sub-portion 112B is connected to the second display portion 102 through the second transfer portion 1042, and first data signal lines DL1 of the second extending sub-portion 112B are connected to the bonding portion 103 by data signal transfer lines 106 of the second transfer portion 1042.

For example, the transfer portion 104 may be stretched to be deformed, and the transfer portion 104 may be bent to the non-display surface N1 of the second display portion 102 (as shown in FIG. 7) to reduce an influence of the transfer portion 104 on a width of a border. Furthermore, the transfer portion 104 has a stretchable property, so that the first display portion 101 and the second display portion 102 may fit well, and thus the display panel 100 has a good display effect.

In the embodiments of the present disclosure, by providing the data signal transfer lines 106 of the transfer portion 104, the first data signal lines DL1 do not need to be fully connected to the multi-path selection circuit to be further connected to the second data signal lines Data of the second display portion 102. Instead, the first data signal line DL1 and the bonding portion 103 may be connected by a short signal line, so that a transmission path of a data signal transmitted from the bonding portion 103 to the first sub-pixels P1 of the extending sub-portion 1012 may be greatly shortened, thereby be beneficial to reducing the voltage drop of the signal transmission.

In some embodiments, as shown in FIG. 5, the second display portion 102 includes a second display area AA2 and a second peripheral area BB2 disposed around the second display area AA2. The second display area AA2 is provided with a plurality of second sub-pixels P2. Each column of second sub-pixels P2 are arranged in the third direction T, and each row of second sub-pixels P2 are arranged in the fourth direction W. For example, the third direction T and the fourth direction W are perpendicular to each other.

The second display portion 102 includes second data signal lines DL2 and second scanning signal lines GL2. A second data signal line DL2 is connected to at least one column of second sub-pixels P2. FIG. 5 shows a case where a second data signal line DL2 is connected to a column of second sub-pixels P2. A second scanning signal line GL2 is connected to at least one row of second sub-pixels P2. FIG. 5 shows a case where a second scanning signal line GL2 is connected to a row of second sub-pixels P2.

The second peripheral area BB2 is provided with a second gate driver circuit 50, and the second gate driver circuit 50 includes a plurality of shift registers GOA2 that are cascaded. The second scanning signal line GL2 is connected to a shift register GOA2 of the second gate driver circuit 50, the second gate driver circuit 50 is connected to the bonding portion 103, and the shift register GOA2 of the second gate driver circuit 50 is used to provide a gate driving signal to the second sub-pixels P2.

In some embodiments, as shown in FIG. 5, the second display portion 102 has a second peripheral area BB2. The second display portion 102 includes first fan-out lines 111 disposed in the second peripheral area BB2, and the data signal transfer line 106 is connected to the bonding portion 103 by a first fan-out line 111.

For example, as shown in FIG. 5, the first data signal line DL1 is connected to a data signal transfer line 106 of the transfer portion 104, and the data signal transfer line 106 is connected to the bonding portion 103 by a first fan-out line 111, so as to achieve the purpose of transmitting the data signal from the bonding portion 103 to the first data signal line DL1.

In some embodiments, as shown in FIG. 5, the display panel 100 further includes a transition portion 107, which is connected between the connecting sub-portion 1011 and the second display portion 102. The transition portion 107 includes a multi-path selection circuit 108, and first data signal lines DL1 located in the connecting sub-portion 1011 are connected to the multi-path selection circuit 108. The second display portion 102 further includes second data signal lines DL2. An end of a second data signal line DL2 is connected to the multi-path selection circuit 108, and the other end of the second data signal line DL2 is connected to the bonding portion 103.

In the embodiments provided in the present disclosure, a plurality of first sub-pixels P1 of the first display portion 101 are connected to the bonding portion 103 in two ways to achieve transmission of data signals. Multiple first sub-pixels P1 of the connecting sub-portion 1011 implement transmission of data signals through the multi-path selection circuit 108 of the transition portion 107. Multiple first sub-pixels P1 of the extending sub-portion 1012 are connected to the bonding portion 103 by data signal transfer lines 106 of the transfer portion 104, so as to achieve transmission of data signals. The multiple first sub-pixels P1 of the extending sub-portion 1012 may be directly connected to the bonding portion 103 by the data signal transfer lines 106 without going through the multi-path selection circuit 108. Such provision may reduce the voltage drop of the signal line.

In some examples, as shown in FIG. 5, the display panel 100 further includes fourth fan-out lines 124, and the first data signal line DL1 is connected to the multi-path selection circuit 108 by the fourth fan-out line 124. The second display portion 102 further includes fifth fan-out lines 126 disposed in the second peripheral area BB2, and the multi-path selection circuit 108 is connected to the second data signal lines DL2 by the fifth fan-out lines 126. The second display portion 102 further includes second fan-out lines 127 disposed in the second peripheral area BB2, and the second data signal lines DL2 are connected to the bonding portion 103 by the second fan-out lines 127. With the above design, the first sub-pixel P1 of the connecting sub-portion 1011 and the second sub-pixel P2 of the second display area AA2 may share the data signal.

For example, the display panel 100 includes a substrate, and a pixel circuit stack layer and a light-emitting device stack layer that are sequentially disposed on the substrate.

The pixel circuit stack layer includes a shielding layer, a semiconductor layer, a first gate metal layer, a second gate metal layer, a first source-drain metal layer, a second source-drain metal layer, a third source-drain metal layer and an indium tin oxide (ITO) layer that are sequentially disposed in a direction away from the substrate.

The light-emitting device stack layer includes an anode layer, a pixel defining layer, a light-emitting function layer and a cathode layer.

It will be noted that an insulating layer is provided between adjacent layers of the shielding layer, the semiconductor layer, the first gate metal layer, the second gate metal layer, the first source-drain metal layer, the second source-drain metal layer, the third source-drain metal layer, the ITO layer and the anode layer, and film layers that need to be connected are connected through a via hole extending through the insulating layer(s).

For example, the plurality of fourth fan-out lines 124 are provided in the shielding layer, the third source-drain metal layer and the ITO layer, the plurality of fifth fan-out lines 126 are provided in the shielding layer, the third source-drain metal layer and the ITO layer, and it is avoided that the plurality of fourth fan-out lines 124 and the plurality of fifth fan-out lines 126 are located in the same film layer, so as to effectively prevent signal crosstalk caused by dense arrangement of the fourth fan-out lines 124 and the fifth fan-out lines 126.

In some examples, the transition portion 107 includes a plurality of multi-path selection circuits 108, and each multi-path selection circuit 108 is connected to a first data signal line DL1 and N second data signal lines DL2, where N is an integer greater than or equal to 2.

For example, the control mode of the multi-path selection circuit 108 is 1:2, 1:3, 1:4, 1:6 or 1:8, that is, a multi-path selection circuit 108 may realize the connection between a first data signal line DL1 of the connecting sub-portion 1011 and 2, 3, 4, 6 or 8 second data signal lines DL2 of the second display portion 102, which is not limited in the embodiments of the present disclosure.

For example, N takes a value of 2, 3, 4, 6 or 8, which is not limited here.

In some examples, a plurality of second data signal lines DL2 of the second display portion 102 are connected to the multi-path selection circuit 108; alternatively, some of the plurality of second data signal lines DL2 of the second display portion 102 are connected to the multi-path selection circuit 108, which is not limited here.

In some embodiments, as shown in FIG. 5, the two extending sub-portions 1012 are symmetrically disposed relative to the first center line L1, and data signal transfer lines 106 of the two transfer portions 104 are symmetrically disposed relative to the first center line L1.

For example, as shown in FIG. 5, the two extending sub-portions 1012 are symmetrically provided at both ends of the connecting sub-portion 1011, and a symmetry line of the two extending sub-portions 1012 is the first center line L1. The first transfer portion 1041 and the second transfer portion 1042 are symmetrically provided relative to the first center line L1, and data signal transfer lines 106 of the first transfer portion 1041 and data signal transfer lines 106 of the second transfer portion 1042 are symmetrically provided relative to the first center line L1. The above symmetrical provision is beneficial for process manufacture, and the display quality may be improved.

In some embodiments, as shown in FIG. 5, the first display portion 101 further includes third control signal lines 109. The third control signal line 109 is disposed in the first peripheral area BB1 and extends substantially in the first direction X, and the third control signal line 109 connects the first gate driver circuit 40 and the bonding portion 103.

For example, as shown in FIG. 5, the third control signal line 109 includes a plurality of control signal lines, and the plurality of control signal lines include a plurality of clock signal lines (e.g., a first clock signal line CLCK1 and a second clock signal line CLCK2), a first voltage bus VGH, a second voltage bus VGL, an initial signal line and a reset signal line and the like, which are not limited here. The third control signal line 109 is used to transmit control signals to the first gate driver circuit 40, and the control signals include at least one of a clock signal provided by the clock signal line, a high voltage signal provided by the first voltage bus VGH, a low voltage signal provided by the second voltage bus VGL, an initial signal provided by the initial signal line, a reset signal provided by the reset signal line, and other signals.

In some embodiments, as shown in FIG. 5, in a case where the display panel 100 further includes the transfer portions 104, the transfer portion 104 includes a control signal transfer line 105, and the third control signal line 109 is connected to the bonding portion 103 by the control signal transfer line 105.

For example, as shown in FIG. 5, the first gate driver circuit 40 is connected to the third control signal line 109. The third control signal line 109 includes a plurality of control signal lines, and the plurality of control signal lines include a plurality of clock signal lines (e.g., a first clock signal line CLCK1 and a second clock signal line CLCK2), a first voltage bus VGH, a second voltage bus VGL, an initial signal line and a reset signal line, which are not limited here. Accordingly, the control signal transfer line 105 may include a plurality of transfer lines, and the plurality of transfer lines are connected to the plurality of control signal lines included in the third control signal line 109 in one to one correspondence, and are used to transmit corresponding control signals to the first gate driver circuit 40.

For example, the control signal transfer line 105 includes a first clock signal transfer line, a first voltage transfer line, a reset signal transfer line, and the like. The first clock signal transfer line is used to connect the first clock signal line CLCK1 and the bonding portion 103 for transmitting a clock signal. The first voltage transfer line is used to connect the first voltage bus VGH and the bonding portion 103 for transmitting a high voltage signal. The reset signal transfer line is used to connect the reset signal line and the bonding portion 103 for transmitting a reset signal.

In some embodiments, as shown in FIG. 5, the second display portion 102 has a second peripheral area BB2, the second display portion 102 includes third fan-out lines 110 disposed in the second peripheral area BB2, and the control signal transfer line 105 is connected to the bonding portion 103 by a third fan-out line 110.

For example, as shown in FIG. 5, the third fan-out line 110 includes a plurality of fan-out lines, the plurality of fan-out lines of the third fan-out line 110 are connected to the plurality of transfer lines of the control signal transfer line 105 in one to one correspondence, and the plurality of fan-out lines of the third fan-out line 110 are connected to the bonding portion 103.

In the embodiments of the present disclosure, the provision of the control signal transfer lines 105 of the transfer portions 104 realizes the connection between the bonding portion 103 and the first gate driver circuits 40, which is used to transmit the control signals to the first gate driver circuit 40. The first gate driver circuit 40 is connected to a plurality of first sub-pixels P1, and the first gate driver circuit 40 is used to provide gate signals to the plurality of first sub-pixels P1.

Moreover, the third control signal line 109 may be directly connected to the second peripheral area BB2 of the second display portion 102 by the control signal transfer line 105 of the transfer portion 104, and then connected to the bonding portion 103 by the third fan-out line 110. There is no need to provide a signal line, from the first display portion 101 to the second peripheral area BB2 of the second display portion 102, connected to the bonding portion 103 (e.g., the first scanning fan-out line 125 as shown in FIG. 3), thereby shortening the length of the signal line connecting the third control signal line 109 and the bonding portion 103 and reducing the signal voltage drop.

In some embodiments, as shown in FIG. 5, the first display portion 101 has two first peripheral areas BB1 which are respectively located at two ends of an arc in which the first display portion 101 appears. The first display portion 101 includes two first gate driver circuits 40 which are respectively located in the two first peripheral areas BB1.

There are two ends of the arc in which the first display portion 101 appears. As shown in FIG. 5, both ends of the arc in which the first display portion 101 appears are the first peripheral areas BB1. For example, a first peripheral area BB1 at the left end of the arc presented by the first display portion 101 is called a left peripheral area BB11, and a first peripheral area BB1 at the right end of the arc presented by the first display portion 101 is called a right peripheral area BB12. The first gate driver circuit 40 may be provided in the left peripheral area BB11 or in the right peripheral area BB12, alternatively, the first gate driver circuits 40 may be provided in both the left peripheral area BB11 and the right peripheral area BB12. FIG. 5 shows a case where the first gate driver circuits 40 are provided in both the left peripheral area BB11 and the right peripheral area BB12.

In some embodiments, as shown in FIG. 5, each first gate driver circuit 40 includes a plurality of shift registers GOA1 that are cascaded. Each first scanning signal line GL1 extends from a first peripheral area BB1 to another first peripheral area BB1, and two ends of the first scanning signal line GL1 are each connected to a shift register GOA1.

For example, as shown in FIG. 5, the first peripheral area BB1 includes a left peripheral area BB11 and a right peripheral area BB12, and the left peripheral area BB11 and the right peripheral area BB12 are each provided with a first gate driver circuit 40. Each first scanning signal line GL1 extends from the left peripheral area BB11 to the right peripheral area BB12. A left end of the first scanning signal line GL1 is connected to a shift register GOA1 in the left peripheral area BB11, and a right end of the first scanning signal line GL1 is connected to a shift register GOA1 in the right peripheral area BB12.

In the embodiments of the present disclosure, a first scanning signal line GL1 is connected to two shift registers GOA1, so that the problem of transmission delay of the gate signal may be effectively solved, thereby ensuring a driving effect of the shift register GOA1 on the first sub-pixels P1 and improving the display effect of the first display portion 101.

In some other examples, half of the first sub-pixels P1 at the left side in at least one column of first sub-pixels P1 are connected to shift registers GOA1 in the left peripheral area BB11, and half of the first sub-pixels P1 at the right side in at least one column of first sub-pixels P1 are connected to shift registers GOA1 in the right peripheral area BB12, so that the at least one column of first sub-pixels P1 may be controlled separately by two shift registers GOA1. Since each shift register GOA1 only needs to control half of the first sub-pixels P1 in each column of the first sub-pixels P1, the problem of transmission delay of the gate signal may be reduced.

In some embodiments, as shown in FIG. 5, the transfer portion 104 is provided with a plurality of openings K therein. In a case where the display panel 100 includes the data signal transfer lines 106, the data signal transfer lines 106 are provided bypassing the plurality of openings K. In a case where the display panel 100 includes the control signal transfer lines 105, the control signal transfer lines 105 are provided bypassing the plurality of openings K.

The provision of the plurality of openings K of the transfer portion 104 is beneficial to reducing stress applied on the transfer portion 104 during stretching deformation, thereby reducing the risk of the transfer portion 104 being bent and damaged and reducing the risk of the control signal transfer line 105 and the data signal transfer line 106 being broken.

For example, the opening K is in a shape of a circle, an ellipse, a rectangle, a square, a parallelogram, a trapezoid, and any other shape, and is not specifically limited in the embodiments of the present disclosure. It can be understood that shapes and distribution positions of the openings shown in FIG. 5 are only exemplary, and the distribution positions of the openings K are not specifically limited in the present disclosure.

For example, the control signal transfer line 105 and the data signal transfer line 106 are bendable, thereby effectively preventing the transfer lines from being broken.

For example, the transfer portion 104 includes a shielding layer, a third source-drain metal layer and other metal film layers, and the data signal transfer lines 106 may be disposed in different metal film layers and designed in parallel to reduce resistance.

Figure 8:
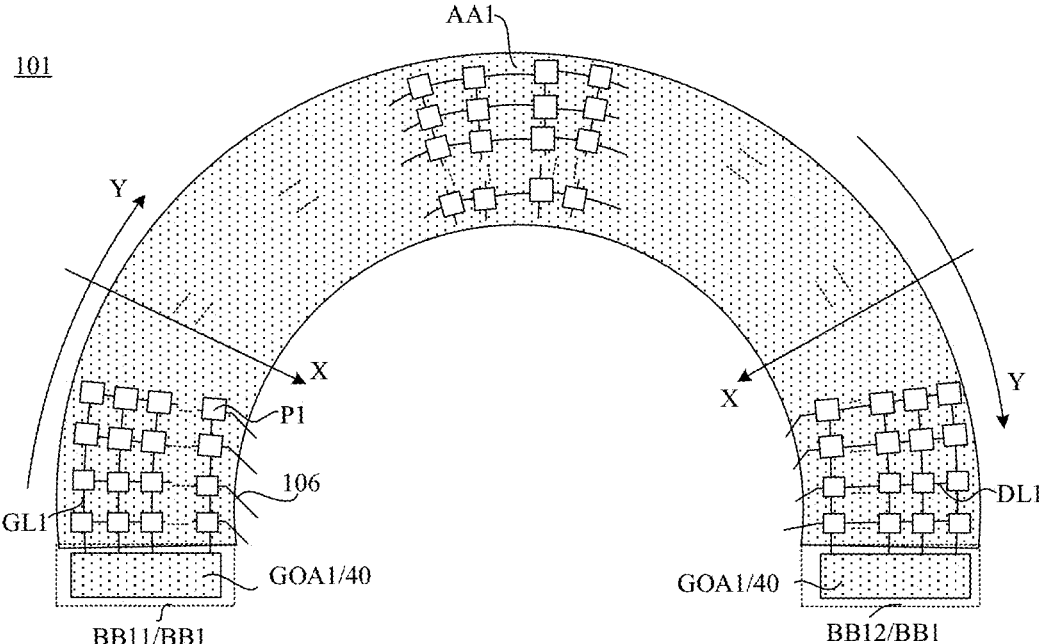
FIG. 8 is a structural diagram of a first display portion, in accordance with some embodiments of the present disclosure.

In some embodiments, as shown in FIG. 8, a plurality of first sub-pixels P1 are arranged in a radial pattern, so that the first data signal line DL1 is connected to at least one row of first sub-pixels P1, and the first scanning signal line GL1 is connected to at least one column of first sub-pixels P1.

In some examples, as shown in FIG. 8, in the first direction X, an arrangement density of a column of first sub-pixels P1 farther away from the second display portion 102 (as shown in FIG. 5) is less than or equal to an arrangement density of a column of first sub-pixels P1 closer to the second display portion 102 (as shown in FIG. 5).

For example, in a case where an included angle α between the non-display surface N1 of the first display portion 101 and the non-display surface N1 of the second display portion 102 is 90°, an arrangement density of a column of first sub-pixels P1 farther away from the second display portion 102 (as shown in FIG. 5) may be set equal to an arrangement density of a column of first sub-pixels P1 closer to the second display portion 102 (as shown in FIG. 5).

In a case where an included angle α between the non-display surface N1 of the first display portion 101 and the non-display surface N1 of the second display portion 102 is greater than 90°, an arrangement density of a column of first sub-pixels P1 farther away from the second display portion 102 (as shown in FIG. 5) may be set less than an arrangement density of a column of first sub-pixels P1 closer to the second display portion 102 (as shown in FIG. 5).

In some embodiments, as shown in FIG. 5, the display panel 100 further includes a driver chip 200. The driver chip 200 is disposed on the bonding portion 103 and is configured to transmit a signal to the bonding portion 103.

For example, the driver chip 200 is used to provide driving signals for display to the first display portion 101 and the second display portion 102. For example, the driving signals include a power supply voltage signal (including a high voltage signal and a low voltage signal), a data signal, an initial signal and a clock signal.

Figure 9:
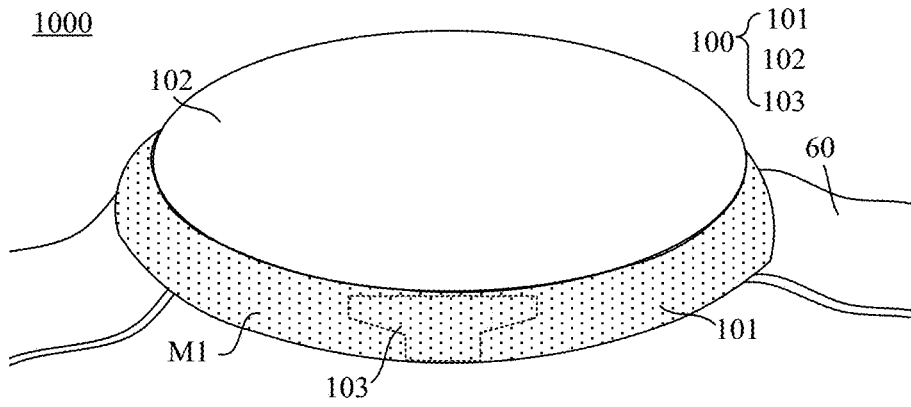
FIG. 9 is a structural diagram of a wearable electronic device, in accordance with some embodiments of the present disclosure.

As shown in FIG. 9, some embodiments of the present disclosure further provide a wearable electronic device 1000. The wearable electronic device 1000 includes the display panel 100 as described in any of the above embodiments. The wearable electronic device 1000 further includes a wearable structure 60. The wearable structure 60 is connected to the display panel 100, and the wearable structure 60 is configured to be wearable on a human body.

For example, the wearable electronic device 1000 is a watch, and the wearable structure 60 is a watch strap of the watch.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A display panel, comprising:

a first display portion and a second display portion, wherein the first display portion extends in an arc shape in a flatten state and surrounds the second display portion in an enclosed state, and the first display portion and the second display portion have an included angle therebetween; and a bonding portion connected to a side of the second display portion, wherein the first display portion has a first display area and at least one first peripheral area, a first peripheral area is located at an end of an arc presented by the first display portion, and the first display portion includes:

a plurality of first sub-pixels disposed in the first display area and arranged in a plurality of rows and a plurality of columns, wherein each row of first sub-pixels are arranged in a first direction, and each column of first sub-pixels are arranged in a second direction; the first direction is a radial direction of the arc, and the second direction is an extending direction of the arc;

a plurality of first scanning signal lines extending substantially in the second direction and each connected to at least one column of first sub-pixels;

a plurality of first data signal lines extending substantially in the first direction and each connected to at least one row of first sub-pixels; and at least one first gate driver circuit disposed in the at least one first peripheral area and connected to the plurality of first scanning signal lines;

a connecting sub-portion connected to another side of the second display portion, the connecting sub-portion and the bonding portion being located on two opposite sides of the second display portion; and two extending sub-portions connected to two ends of the connecting sub-portion; and wherein the display panel further comprises two transfer portions; each transfer portion is connected between an extending sub-portion and the second display portion; the transfer portions are stretchable and deformable, and each transfer portion includes data signal transfer lines, and first data signal lines, located in the two extending sub-portions, in the plurality of first data signal lines are connected to the bonding portion by a plurality of data signal transfer lines including the data signal transfer lines of each transfer portion.

2. The display panel according to claim 1, wherein the second display portion has a second peripheral area; and the second display portion includes first fan-out lines disposed in the second peripheral area, and the plurality of data signal transfer lines are connected to the bonding portion by the first fan-out lines.

3. The display panel according to claim 2, wherein the second display portion further has a second display area, and the second peripheral area is disposed around the second display area; the second display portion further includes:

a plurality of second sub-pixels disposed in the second display area, wherein each column of second sub-pixels are arranged in a third direction, and each row of second sub-pixels are arranged in a fourth direction; the third direction and the fourth direction are perpendicular to each other.

4. The display panel according to claim 3, wherein the second display portion further includes a second gate driver circuit located in the second peripheral area; the second gate driver circuit includes a plurality of shift registers that are cascaded; the second gate driver circuit is connected to the bonding portion, and the shift registers of the second gate driver circuit are used to provide gate driving signals to the second sub-pixels.

5. The display panel according to claim 1, further comprising a transition portion connected between the connecting sub-portion and the second display portion, wherein the transition portion includes at least one multi-path selection circuit, and first data signal lines, located in the connecting sub-portion, in the plurality of first data signal lines are connected to the at least one multi-path selection circuit; and the second display portion includes second data signal lines, ends of part of or all of the second data signal lines are connected to the at least one multi-path selection circuit, and other ends of the second data signal lines are connected to the bonding portion.

6. The display panel according to claim 5, wherein the transition portion includes a plurality of multi-path selection circuits, and each multi-path selection circuit is connected to a single first data signal line and N second data signal lines, where N is an integer greater than or equal to 2.

7. The display panel according to claim 5, wherein the second display portion further includes second fan-out lines disposed in a second peripheral area, and the second data signal lines are connected to the bonding portion by the second fan-out lines.

8. The display panel according to claim 5, further comprising fourth fan-out lines, wherein the first data signal lines located in the connecting sub-portion are connected to the at least one multi-path selection circuit by the fourth fan-out lines.

9. The display panel according to claim 1, wherein the two extending sub-portions are disposed symmetrically relative to a first center line, and data signal transfer lines of the two transfer portions are disposed symmetrically relative to the first center line.

10. The display panel according to claim 1, wherein the first display portion further includes:

at least one third control signal line disposed in the at least one first peripheral area and extending substantially in the first direction; wherein a third control signal line connects a first gate driver circuit and the bonding portion.

11. The display panel according to claim 10, wherein each transfer portion includes a control signal transfer line, and the third control signal line is connected to the bonding portion by the control signal transfer line.

12. The display panel according to claim 11, wherein the transfer portion is provided with a plurality of openings therein; and the control signal transfer line is disposed bypassing the plurality of openings.

13. The display panel according to claim 1, wherein the first display portion has two first peripheral areas located at two ends of the arc presented by the first display portion;

the first display portion includes two first gate driver circuits respectively located in the two first peripheral 5 areas;

each first gate driver circuit includes a plurality of shift registers that are cascaded;

each first scanning signal line extends from a first peripheral area to another first peripheral area, and two ends 10 of the first scanning signal line are each connected to a shift register.

14. The display panel according to claim 1, wherein the transfer portion is provided with a plurality of openings therein; and the data signal transfer lines are disposed 15 bypassing the plurality of openings.

15. The display panel according to claim 1, wherein the second display portion includes a display surface and a non-display surface that are opposite to each other, the bonding portion is capable of being bent to the non-display 20 surface of the second display portion, and the transfer portions are capable of being bent to the non-display surface of the second display portion.

16. The display panel according to claim 1, wherein the plurality of first sub-pixels are arranged in a radial pattern. 25

17. The display panel according to claim 16, wherein in the first direction, an arrangement density of a column of first sub-pixels farther away from the second display portion is less than or equal to an arrangement density of a column of first sub-pixels closer to the second display portion. 30

18. A wearable electronic device, comprising:

the display panel according to claim 1; and a wearable structure connected to the display panel, wherein the wearable structure is configured to be wearable on a human body. 35

19. A display panel, comprising:

a first display portion and a second display portion, wherein the first display portion extends in an arc shape in a flatten state and surrounds the second display portion in an enclosed state, and the first display portion 40 and the second display portion have an included angle therebetween; and a bonding portion connected to a side of the second display portion, wherein the first display portion has a first display area and at least one first peripheral area, a first peripheral area is located at an end of an arc presented by the first display portion, and the first display portion includes:

a plurality of first sub-pixels disposed in the first display area and arranged in a plurality of rows and a plurality of columns, wherein each row of first sub-pixels are arranged in a first direction, and each column of first sub-pixels are arranged in a second direction; the first direction is a radial direction of the arc, and the second direction is an extending direction of the arc;

a plurality of first scanning signal lines extending substantially in the second direction and each connected to at least one column of first sub-pixels;

a plurality of first data signal lines extending substantially in the first direction and each connected to at least one row of first sub-pixels;

at least one first gate driver circuit disposed in the at least one first peripheral area and connected to the plurality of first scanning signal lines; and at least one third control signal line disposed in the at least one first peripheral area and extending substantially in the first direction; wherein a third control signal line connects a first gate driver circuit and the bonding portion;

wherein the display panel further comprises a transfer portion, wherein the transfer portion includes a control signal transfer line, and the third control signal line is connected to the bonding portion by the control signal transfer line.

20. The display panel according to claim 19, wherein the second display portion has a second peripheral area; and the second display portion includes a third fan-out line disposed in the second peripheral area, and the control signal transfer line is connected to the bonding portion by third fan-out line.

* * * * *